(12) United States Patent
Aboketaf et al.

(10) Patent No.: US 11,609,377 B2
(45) Date of Patent: Mar. 21, 2023

(54) PHOTODETECTORS AND TERMINATORS HAVING A CURVED SHAPE

(71) Applicant: GLOBALFOUNDRIES U.S. Inc., Santa Clara, CA (US)

(72) Inventors: Abdelsalam Aboketaf, Essex Junction, VT (US); Yusheng Bian, Ballston Lake, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 58 days.

(21) Appl. No.: 17/306,334

(22) Filed: May 3, 2021

(65) Prior Publication Data
US 2022/0350079 A1 Nov. 3, 2022

(51) Int. Cl.
G02B 6/122 (2006.01)
G02B 6/13 (2006.01)
G02B 6/125 (2006.01)
G02B 6/12 (2006.01)

(52) U.S. Cl.
CPC .......... *G02B 6/1228* (2013.01); *G02B 6/125* (2013.01); *G02B 6/131* (2013.01); *G02B 2006/12061* (2013.01)

(58) Field of Classification Search
CPC ....... G02B 6/1228; G02B 6/125; G02B 6/131
See application file for complete search history.

(56) References Cited

U.S. PATENT DOCUMENTS

| | | | |
|---|---|---|---|
| 6,180,945 B1 | 1/2001 | Barton et al. | |
| 10,103,280 B1 | 10/2018 | Ellis-Monaghan et al. | |
| 10,720,538 B2 | 7/2020 | Assefa et al. | |
| 10,910,503 B1 * | 2/2021 | Bian | G02B 6/13 |
| 2012/0213468 A1 | 8/2012 | Lipson et al. | |
| 2017/0322377 A1 * | 11/2017 | Dumais | G02B 6/125 |
| 2021/0041628 A1 * | 2/2021 | Bian | G02B 6/243 |
| 2022/0091331 A1 * | 3/2022 | Bian | G02B 6/124 |

FOREIGN PATENT DOCUMENTS

| | | | | |
|---|---|---|---|---|
| CN | 114068736 A | * | 2/2022 | |
| DE | 102021122985 A1 | * | 4/2022 | H01L 31/02327 |

OTHER PUBLICATIONS

Judson Holt et al., "Multiple Waveguide Coupling to One or More Photodetectors", filed Jun. 15, 2020 as U.S. Appl. No. 16/901,509.
Abdelsalam Aboketaf et al., "Photodetectors Including a Coupling Region With Multiple Tapers", filed Oct. 8, 2020 as U.S. Appl. No. 17/065,839.

(Continued)

*Primary Examiner* — Eric Wong
(74) *Attorney, Agent, or Firm* — Thompson Hine LLP; Anthony Canale (57) ABSTRACT

Structures for a photodetector or terminator and methods of fabricating a structure for a photodetector or terminator. The structure includes a waveguide core having a longitudinal axis, a pad connected to the waveguide core, and a light-absorbing layer on the pad adjacent to the waveguide core. The light-absorbing layer includes an annular portion, a first taper, and a second taper laterally spaced from the first taper. The first taper and the second taper are positioned adjacent to the waveguide core.

20 Claims, 11 Drawing Sheets

(56) References Cited

OTHER PUBLICATIONS

Siva P. Adusumilli, et al., "Photodiode and/or Pin Diode Structures", filed May 29, 2020 as U.S. Appl. No. 16/887,375.

Mark D. Levy et al., "Photodiode and/or Pin Diode Structures", filed Jul. 22, 2020 as U.S. Appl. No. 16/935,954.

H. Chen, et al., "-1 V bias 67 GHz bandwidth Si-contacted germanium waveguide p-i-n photodetector for optical links at 56 Gbps and beyond," Opt. Express 24, 4622-4631 (2016).

H. Yu, et al., "High-Efficiency p-i-n Photodetectors on Selective-Area-Grown Ge for Monolithic Integration," in IEEE Electron Device Letters, vol. 30, No. 11, pp. 1161-1163, Nov. 2009.

Yue Zhao et al., "High performance silicon-based GeSn p-i-n photodetectors for short-wave infrared application", 2019 Chinese Phys. B 28(12).

Seo, et al., "Design of Microdisk-Shaped Ge on Si Photodetector with Recess Structure for Refractive-Index Sensing" Sensors 19, No. 23: 5253.

Chatterjee et al., "Compact ring resonator enhanced silicon metal-semiconductor-metal photodetector in SiN-on-SOI platform", Opt Express. Oct. 26, 2020;28(22).

Tran et al., "Study of GeSn Mid-infrared Photodetectors for High Frequency Applications", Front. Mater., Nov. 7, 2019.

Sahba Talebi Fard, et al., "Silicon-on-insulator sensors using integrated resonance-enhanced defect-mediated photodetectors," Opt. Express 22, 28517-28529 (2014).

Vladimir Stojanovic, et al., "Monolithic silicon-photonic platforms in state-of-the-art CMOS SOI processes [Invited]," Opt. Express 26, 13106-13121 (2018).

X. Li, et al., "40 Gb/s All-Silicon Photodetector Based on Microring Resonators," in IEEE Photonics Technology Letters, vol. 27, No. 7, pp. 729-732,1 Apr. 1, 2015, doi: 10.1109/LPT.2015.2390619.

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611.

Y. Bian, et al., "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optical Society of America, 2020), paper FW5D.2.

M. Rakowski, et al., "45nm CMOS—Silicon Photonics Monolithic Technology (45CLO) for next-generation, low power and high speed optical interconnects," in Optical Fiber Communication Conference (OFC) 2020, OSA Technical Digest (Optical Society of America, 2020), paper T3H.3.

Liao et al. "36 GHz submicron silicon waveguide germanium photodetector" Optics Express, vol. 19, issue 11, p. 10967.

* cited by examiner

PHOTODETECTORS AND TERMINATORS HAVING A CURVED SHAPE

BACKGROUND

The present invention relates to photonics chips and, more specifically, to structures for a photodetector or terminator and methods of forming a structure for a photodetector or terminator.

Photonics chips are used in many high-speed applications and systems including, but not limited to, data communication systems and data computation systems. A photonics chip integrates optical components, such as waveguides, optical switches, and directional couplers, and electronic components, such as field-effect transistors, into a unified platform. Among other factors, layout area, cost, and operational overhead may be reduced by the integration of both types of components on a single chip.

Photonics chips may include photodetectors that convert optical signals in the form of modulated light pulses into an electrical signal. A photodetector may suffer from significant back reflection due to a refractive index mismatch between the material of the photodetector and the material of a waveguide supplying the light pulses to the photodetector. Back reflection contributes to optical return loss, and also contributes to reductions in both responsivity and quantum efficiency. Conventional photodetectors may also have a large device footprint, which may degrade the optical-to-electrical bandwidth.

Improved structures for a photodetector or terminator and methods of fabricating a structure for a photodetector or terminator are needed.

SUMMARY

In an embodiment of the invention, a structure includes a waveguide core having a longitudinal axis, a pad connected to the waveguide core, and a light-absorbing layer on the pad adjacent to the waveguide core. The light-absorbing layer includes an annular portion, a first taper, and a second taper laterally spaced from the first taper. The first taper and the second taper are positioned adjacent to the waveguide core.

In an embodiment of the invention, a method includes forming a pad and a waveguide core connected to the pad, and forming a light-absorbing layer on the pad. The light-absorbing layer includes an annular portion, a first taper, and a second taper laterally spaced from the first taper. The first taper and the second taper are positioned adjacent to the waveguide core.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
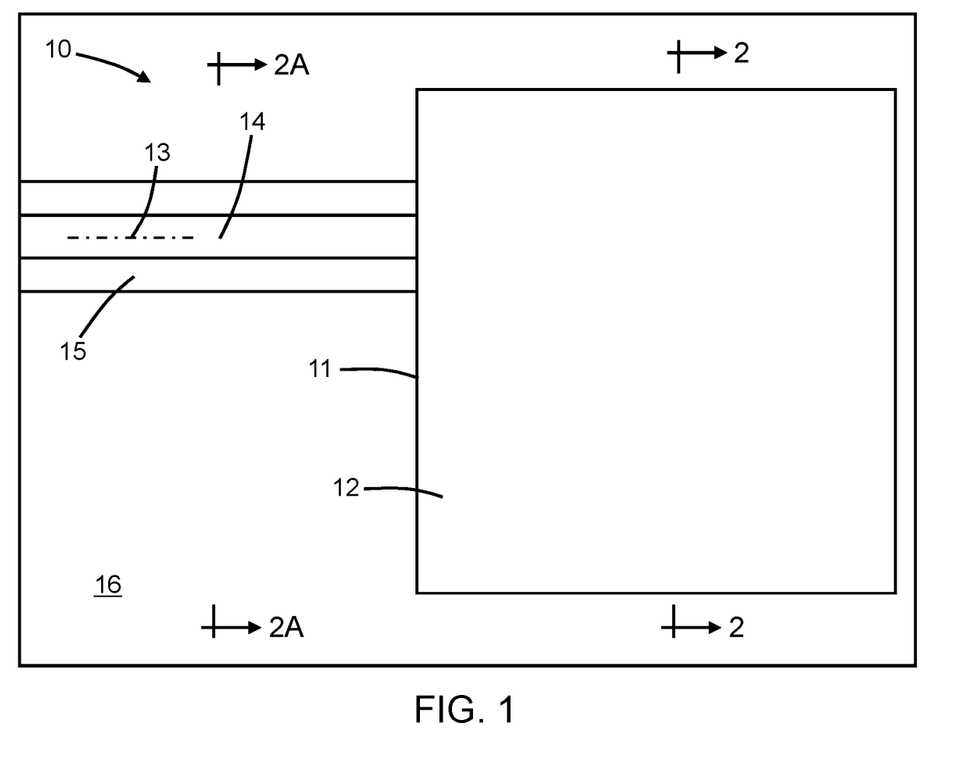
FIG. 1 is a diagrammatic top view of a structure at an initial fabrication stage of a processing method in accordance with embodiments of the invention.
Figure 2:
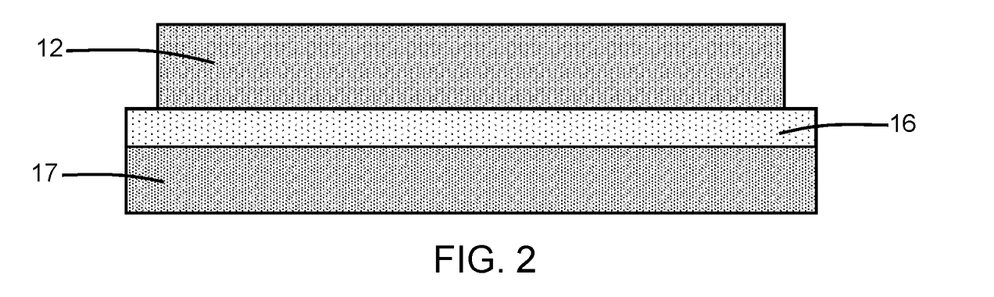
FIG. 2 is a cross-sectional view taken generally along line 2-2 in FIG. 1.
Figure 2A:
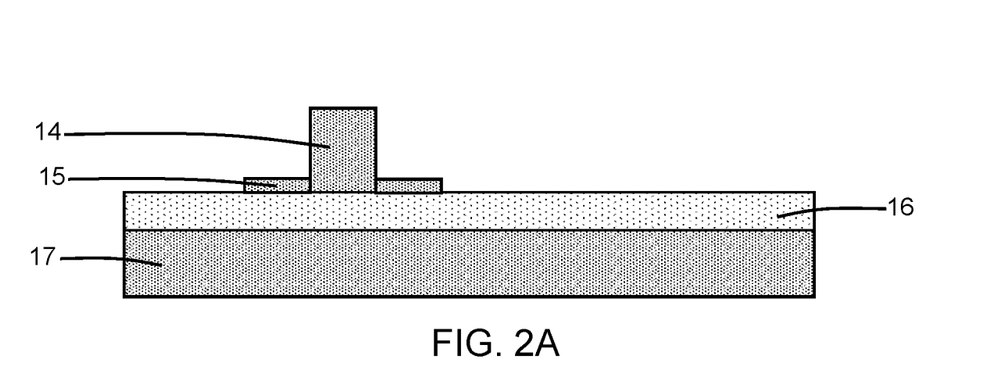
FIG. 2A is a cross-sectional view taken generally along line 2A-2A in FIG. 1.

With reference to FIGS. 1, 2, 2A and in accordance with embodiments of the invention, a structure 10 includes a pad 12 and a waveguide core 14 that is adjoined to the pad 12 at a side edge 11. The waveguide core 14 includes a longitudinal axis 13 that intersects the pad 12. The pad 12 and waveguide core 14 may be comprised of a semiconductor material, such as single-crystal silicon. In an embodiment, the pad 12 and waveguide core 14 may be patterned by lithography and etching processes from a layer of the semiconductor material. The pad 12 and waveguide core 14 may be patterned from the device layer of a semiconductor-on-insulator (SOI) substrate that further includes a dielectric layer 16 in the form of a buried oxide layer and a handle substrate 17. In an embodiment, the structure 10 may further include a thin residual slab 15 that is formed from the patterned semiconductor layer by including an additional patterning step, and that is connected to a lower portion of the waveguide core 14. In an alternative embodiment, the thin residual slab 15 may be omitted.

Figure 3:
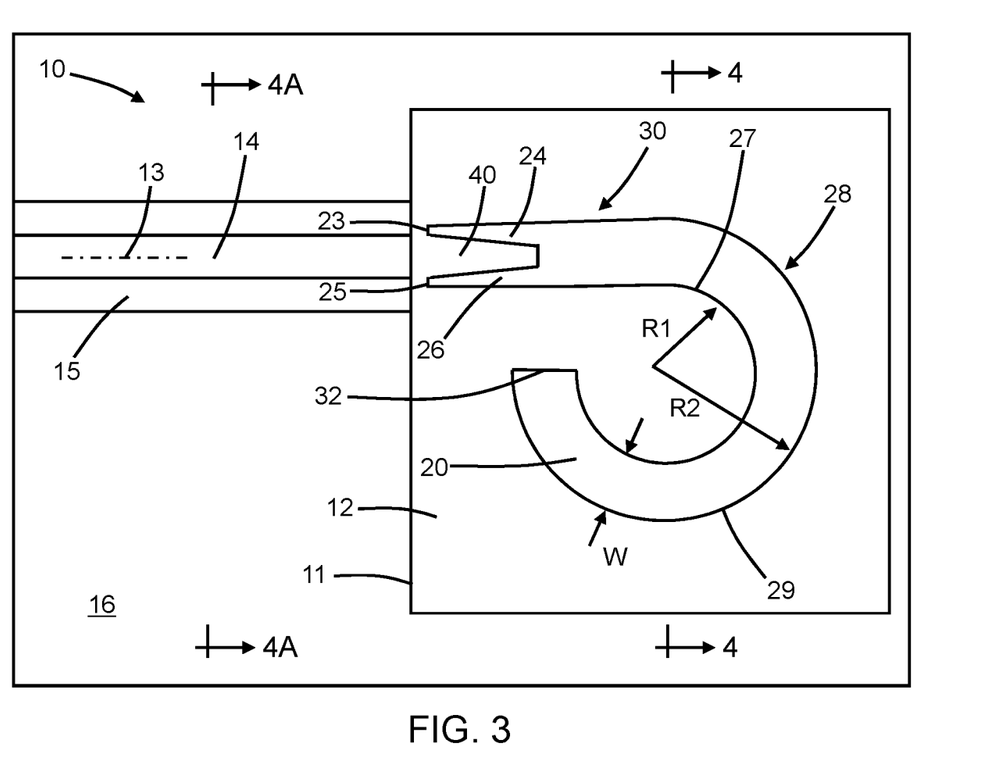
FIG. 3 is a top view of the structure at a fabrication stage of the processing method subsequent to FIG. 1 and in which some dielectric layers are omitted for clarity of illustration.
Figure 4:
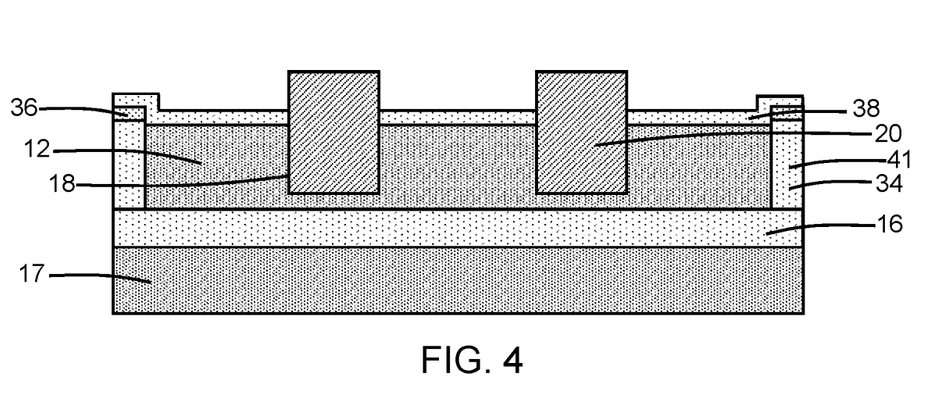
FIG. 4 is a cross-sectional view taken generally along line 4-4 in FIG. 3.
Figure 4A:
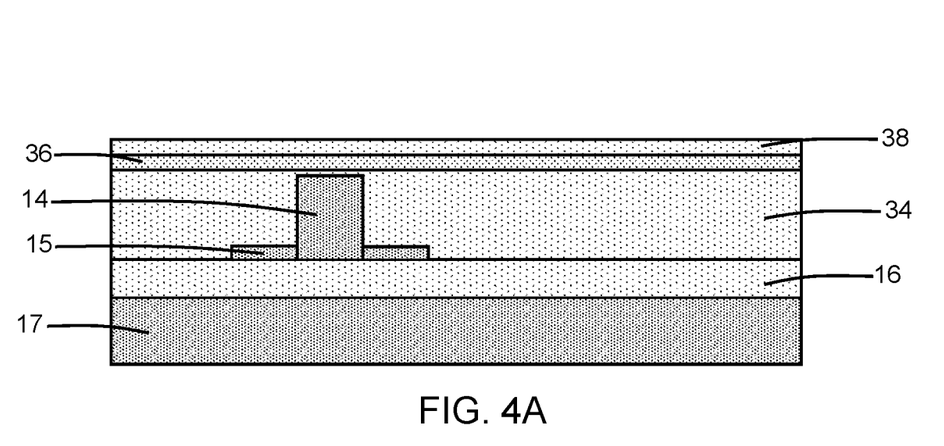
FIG. 4A is a cross-sectional view taken generally along line 4A-4A in FIG. 3.

With reference to FIGS. 3, 4, 4A in which like reference numerals refer to like features in FIGS. 1, 2, 2A and at a subsequent fabrication stage, dielectric layers 34, 36, 38 are sequentially formed on the structure 10. The dielectric layer 34 may be deposited and planarized with chemical-mechanical polishing, and the dielectric layer 36 may be deposited on the planarized dielectric layer 34. The dielectric layers 34, 36 may be removed from the pad 12, and the dielectric layer 38 may be subsequently deposited. The dielectric layer 34 and the dielectric layer 38 may contain silicon dioxide, and the dielectric layer 36 may contain silicon nitride.

The dielectric layer 38 is patterned by lithography and etching processes to define an opening over a portion of the pad 12, and a trench 18 is etched in the pad 12 using the patterned dielectric layer 38 as an etch mask. The trench 18 penetrates partially through the thickness of the pad 12.

A light-absorbing layer 20 is formed inside the trench 18. In an embodiment, the light-absorbing layer 20 may be formed inside the trench 18 by epitaxially growing a light-absorbing material with a chemical vapor deposition process. In an embodiment, the light-absorbing layer 20 may be selectively deposited through selection of deposition conditions such that the light-absorbing material forms inside the trench 18 but not on the dielectric layer 38.

In an embodiment, the light-absorbing layer 20 may define a light-absorbing region of a photodetector. The light-absorbing layer 20 may be comprised of a material that generates charge carriers from absorbed light. In an embodiment, the light-absorbing layer 20 may comprise a material having a composition that includes germanium. In an embodiment, the light-absorbing layer 20 may comprise a material having a composition that exclusively includes germanium. In the representative embodiment, the light-absorbing layer 20 includes a portion that projects, or has a height that is, above a top surface of the pad 12. In an alternative embodiment, the light-absorbing layer 20 may be coplanar with the top surface of the pad 12.

As best shown in FIG. 3, the light-absorbing layer 20 may include an annular portion 28 that terminates at an end 32, tapers 24, 26 that are positioned near or close to, but not necessarily touching, (i.e., adjacent) the waveguide core 14, and an extension 30 that connects the tapers 24, 26 to the annular portion 28. The taper 24 of the light-absorbing layer 20 terminates at an end 23 opposite from the terminating end 32, and the taper 26 of the light-absorbing layer 20 terminates at an end 25 also opposite from the terminating end 32. The ends 23, 25 of the tapers 24, 26 may be non-pointed and blunt. In an embodiment, the waveguide core 14 may be laterally centered between the taper 24 and the taper 26. The extension 30 provides a connector that permits the tapers 24, 26 to be laterally spaced from the annular portion 28 and to be placed adjacent to the waveguide core 14.

A tapered section 40 of semiconductor material is laterally positioned between the taper 24 and the taper 26, which are laterally spaced relative to each other. In an embodiment, the tapered section 40 is laterally centered between the taper 24 and the taper 26. The tapered section 40 contains the same semiconductor material as the waveguide core 14 and a different material from the light-absorbing layer 20. In an embodiment, the longitudinal axis 13 of the waveguide core 14 may be aligned with the tapered section 40 such that the tapered section 40 effectively defines an extended portion of the waveguide core 14.

The annular portion 28 of the light-absorbing layer 20 has a curved shape that includes an inner edge 27 having an inner radius R1 and an outer edge 29 having an outer radius R2 that is greater than the inner radius R1. The inner edge 27 of the annular portion 28 of the light-absorbing layer 20, which starts at the intersection with the extension 30 and ends at the terminating end 32, curves about and partially surrounds a portion of the pad 12. The outer edge 29 of the annular portion 28 of the light-absorbing layer 20, which starts at the intersection with the extension 30 and ends at the terminating end 32, curves about and surrounds the inner edge 27. The annular portion 28 is bounded between the inner edge 27 and the outer edge 29. In an embodiment, the inner and outer radii may be centered about a center point of the annular portion 28. In an embodiment, the inner edge 27 and the outer edge 29 may be arcs of concentric circles. In an embodiment, the inner edge 27 and the outer edge 29 may be arcs of non-concentric circles. The light-absorbing layer 20 has a non-closed shape in which the annular portion 28 is an annular sector (i.e., a sector of an annulus) and is not a full annulus or ring.

The annular portion 28 of the light-absorbing layer 20 has a length dimension measured from the terminating end 32 to the transition from the annular portion 28 to the extension 30, as well as a width dimension that is transverse to the length dimension. In the representative embodiment, the annular portion 28 of the light-absorbing layer 20 may have a constant width dimension W such that the inner edge 27 and the outer edge 29 are separated by a uniform distance over the length of the annular portion 28. In an alternative embodiment, the annular portion 28 of the light-absorbing layer 20 may have a variable width dimension W such that the inner edge 27 and the outer edge 29 are not separated by a uniform distance over the length of the annular portion 28. For example, the width dimension of the annular portion 28 of the light-absorbing layer 20 may exhibit a minimum width at the terminating end 32 and increase with increasing distance from the terminating end 32 with a maximum width occurring at the transition from the annular portion 28 to the extension 30.

Figure 5:
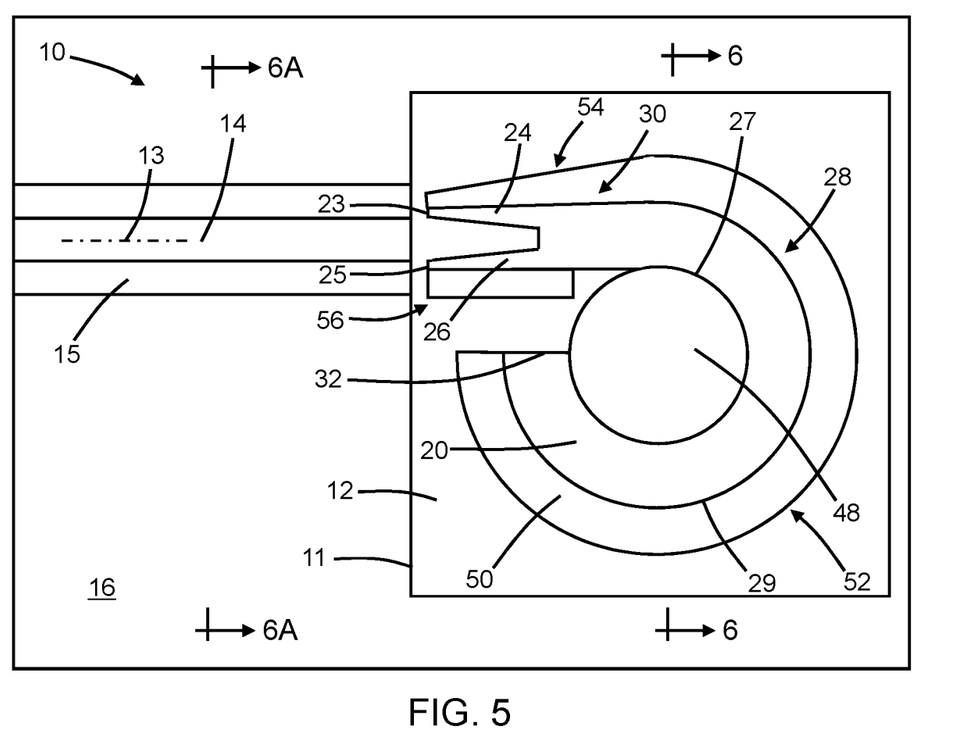
FIG. 5 is a top view of the structure at a fabrication stage of the processing method subsequent to FIG. 3 and in which some dielectric layers are omitted for clarity of illustration.
Figure 6:
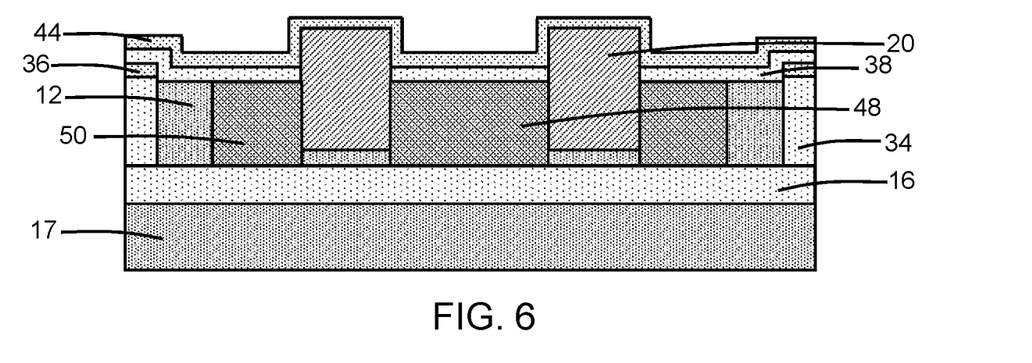
FIG. 6 is a cross-sectional view taken generally along line 6-6 in FIG. 5.
Figure 6A:
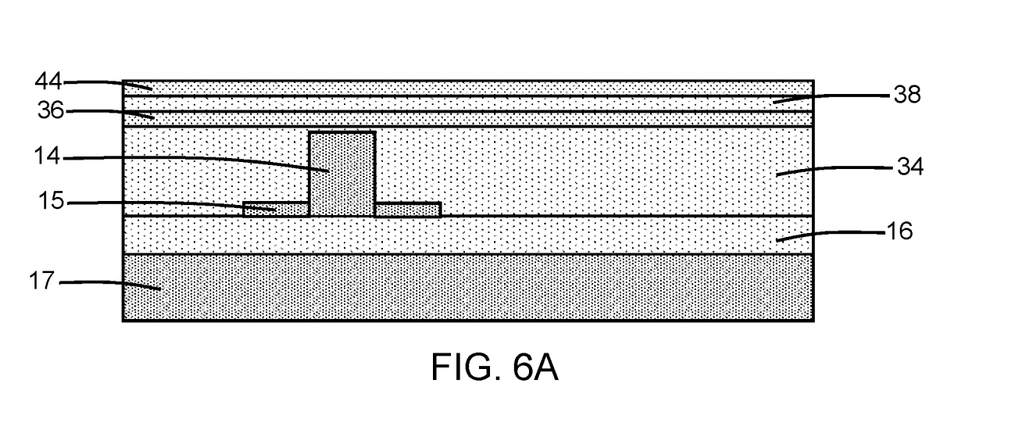
FIG. 6A is a cross-sectional view taken generally along line 6A-6A in FIG. 5.

With reference to FIGS. 5, 6, 6A in which like reference numerals refer to like features in FIGS. 3, 4, 4A and at a subsequent fabrication stage, a dielectric layer 44 comprised of, for example, silicon nitride may be deposited. In an embodiment, the dielectric layer 44 may have a conformal thickness.

Doped regions 48, 50 are formed in respective portions of the pad 12. The doped regions 48, 50 may extend through the entire thickness of the pad 12 to the underlying dielectric layer 16. The doped region 48 and the doped region 50, which have opposite conductivity types, respectively define an anode and a cathode of a photodetector that also includes the light-absorbing layer 20 and the pad 12. The doped region 48 is positioned adjacent to the inner edge 27 of the light-absorbing layer 20, and the doped region 50 is positioned adjacent to the outer edge 29 of the light-absorbing layer 20. In an alternative embodiment, the doped region 48 may extend laterally into a portion of the light-absorbing layer 20 adjacent to the inner edge 27 and/or the doped region 50 may extend laterally into a portion of the light-absorbing layer 20 adjacent to the outer edge 29.

The doped region 48 may be formed by, for example, ion implantation with an implantation mask having an opening that determines the implanted area of the pad 12. The implantation mask may include a layer of a light-sensitive material, such as a photoresist, applied by a spin-coating process, pre-baked, exposed to light projected through a photomask, baked after exposure, and developed with a chemical developer to define an opening arranged over the portion of the pad 12 to be implanted. The implantation conditions (e.g., ion species, dose, kinetic energy) may be selected to tune the electrical and physical characteristics of the doped region 48. The implantation mask may be stripped after forming the doped region 48. In an embodiment, the semiconductor material of the doped region 48 may contain a p-type dopant (e.g., boron) that provides p-type electrical conductivity.

The doped region 50 may be formed by, for example, ion implantation with an implantation mask having an opening that determines the implanted area of the pad 12. The implantation mask may include a layer of a light-sensitive material, such as a photoresist, applied by a spin-coating process, pre-baked, exposed to light projected through a photomask, baked after exposure, and developed with a chemical developer to define openings arranged over the portions of the pad 12 to be implanted. The implantation conditions (e.g., ion species, dose, kinetic energy) may be selected to tune the electrical and physical characteristics of the doped region 50. The implantation mask may be stripped after forming the doped region 50. In an embodiment, the semiconductor material of the doped region 50 may contain an n-type dopant (e.g., phosphorus and/or arsenic) that provides n-type electrical conductivity.

The doped region 48, which is disk shaped, is positioned in the pad 12 adjacent to, and interior of, the inner edge 27 of the annular portion 28 of the light-absorbing layer 20. In the representative embodiment, the doped region 48 has an outer radius that is equal or substantially equal to the inner radius R1 of the inner edge 27. The doped region 48 is partially encircled or surrounded by the annular portion 28 of the light-absorbing layer 20. In an embodiment, the doped region 48 in the pad 12 may be contiguous with the annular portion 28 of the light-absorbing layer 20 at its inner edge 27. In an embodiment, the doped region 48 may fully fill a disk-shaped or round space that is interior of the inner edge 27 of the light-absorbing layer 20. The opening in the implantation mask is shaped to provide the doped region 48 with its shape.

The doped region 50 in the pad 12 includes a section 52 that is positioned adjacent to, and exterior of, the outer edge 29 of the annular portion 28 of the light-absorbing layer 20. In an embodiment, the section 52 of the doped region 50 in the pad 12 may be contiguous with the annular portion 28 of the light-absorbing layer 20 at its outer edge 29. In an embodiment, the section 52 of the doped region 50 in the pad 12 adjacent to the outer edge 29 may be shaped as a sector of an annulus (i.e., an annular sector) and may be contiguous with the annular portion 28 of the light-absorbing layer 20 at its outer edge 29. The doped region 50 in the pad 12 also includes a section 54 that is positioned adjacent to the taper 24 of the light-absorbing layer 20, and a section 56 that is positioned adjacent to the taper 26 of the light-absorbing layer 20. The section 54 of the doped region 50 may be tapered and may terminate at an end adjacent to the end 23 of the taper 24. In an embodiment, the section 54 of the doped region 50 in the pad 12 may be contiguous with the taper 24. The section 56 of the doped region 50 in the pad 12 may be tapered and may terminate at an end adjacent to the end 25 of the taper 26. In an embodiment, the section 56 of the doped region 50 in the pad 12 may be contiguous with the taper 26. The openings in the implantation mask are shaped to provide the sections 52, 54, 56 of the doped region 50 with their shapes and placements.

In an alternative embodiment, the doped regions 48, 50 may be omitted from the structure 10 such that the structure 10 defines a terminator. In an embodiment of the terminator, the annular portion 28 of the light-absorbing layer 20 may be an annular sector that ends, for example, after a 180° change in direction.

In the representative embodiment, the section 52 of the doped region 50 may have a constant width dimension over its curved length. In an alternative embodiment, the section 52 of the doped region 50 may have a variable width dimension over its curved length. For example, the width dimension of the section 52 of the doped region 50 may exhibit a minimum width adjacent to the terminating end 32 of the light-absorbing layer 20 and may increase with increasing distance from the minimum width over its curved length.

Figure 7:
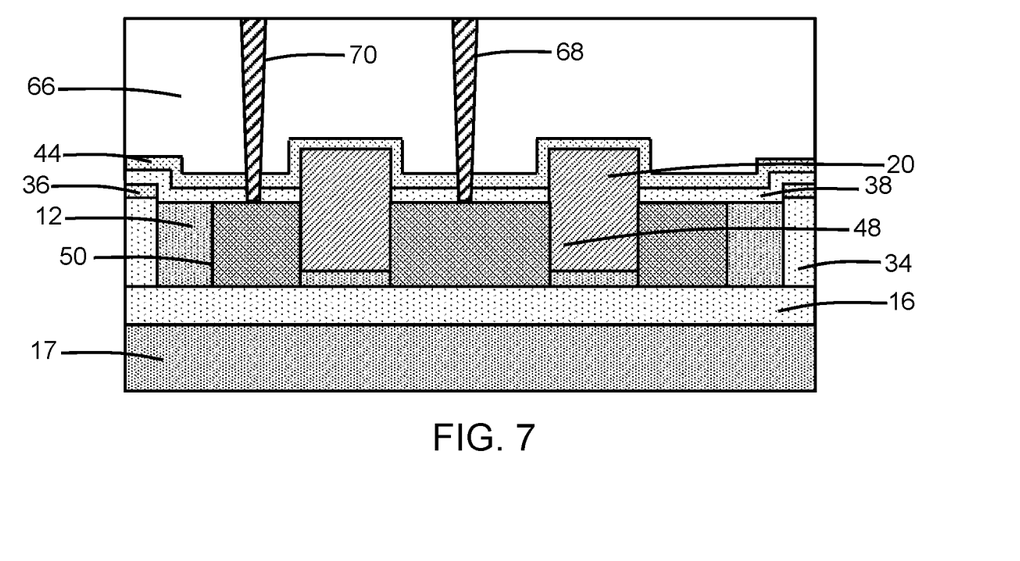
FIGS. 7, 7A are cross-sectional views at a fabrication stage of the processing method subsequent to FIGS. 6, 6A.
Figure 7A:
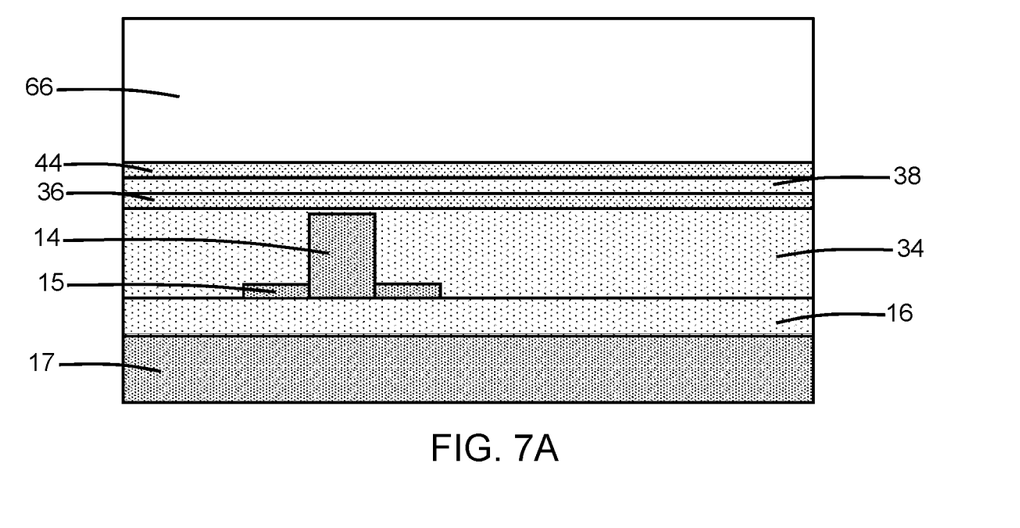

With reference to FIGS. 7, 7A, in which like reference numerals refer to like features in FIGS. 6, 6A and at a subsequent fabrication stage, middle-of-line (MOL) processing and back-end-of-line (BEOL) processing follow, which includes formation of silicide, contacts, vias, and wiring for an interconnect structure that is coupled with the photodetector. In particular, a dielectric layer 66 may be formed and separate sets of contacts 68, 70 may be formed in the dielectric layer 66 that respectively extend to the doped regions 48, 50.

In alternative embodiments, the structure 10 may include an added waveguide core that is positioned in a different level relative to the waveguide core 14. In an embodiment, the added waveguide core may be comprised of a dielectric material, such as silicon nitride, and the added waveguide core may include a taper that is positioned over a taper of the waveguide core 14 to provide an optical coupler that promotes downward optical coupling from the added waveguide core to the waveguide core 14.

In use, laser light may be guided by the waveguide core 14 to the light-absorbing layer 20. The light-absorbing layer 20 absorbs photons of the laser light and converts the absorbed photons into charge carriers. The biasing of the doped regions 48, 50 causes the charge carriers to be collected and output to provide, as a function of time, a measurable photocurrent.

The structure 10 may exhibit improvements in device efficiency and optical-to-electrical bandwidth due at least in part to the compact size of the light-absorbing layer 20 in comparison with conventional photodiodes. The structure 10 may be effective to improve the performance of the photodetector by, for example, suppressing back reflection because of the presence of the tapers 24, 26 that provide efficient optical coupling between the light-absorbing layer 20 and the waveguide core 14.

The light-absorbing layer 20 of the structure 10 is non-spiraled because the annular portion 28 of the light-absorbing layer 20 is curved in a single loop that is either closed or unclosed. The structure 10 does not require dielectric material for electrical isolation of multiple loops arranged in a spiral or concentrically arrangement.

Figure 8:
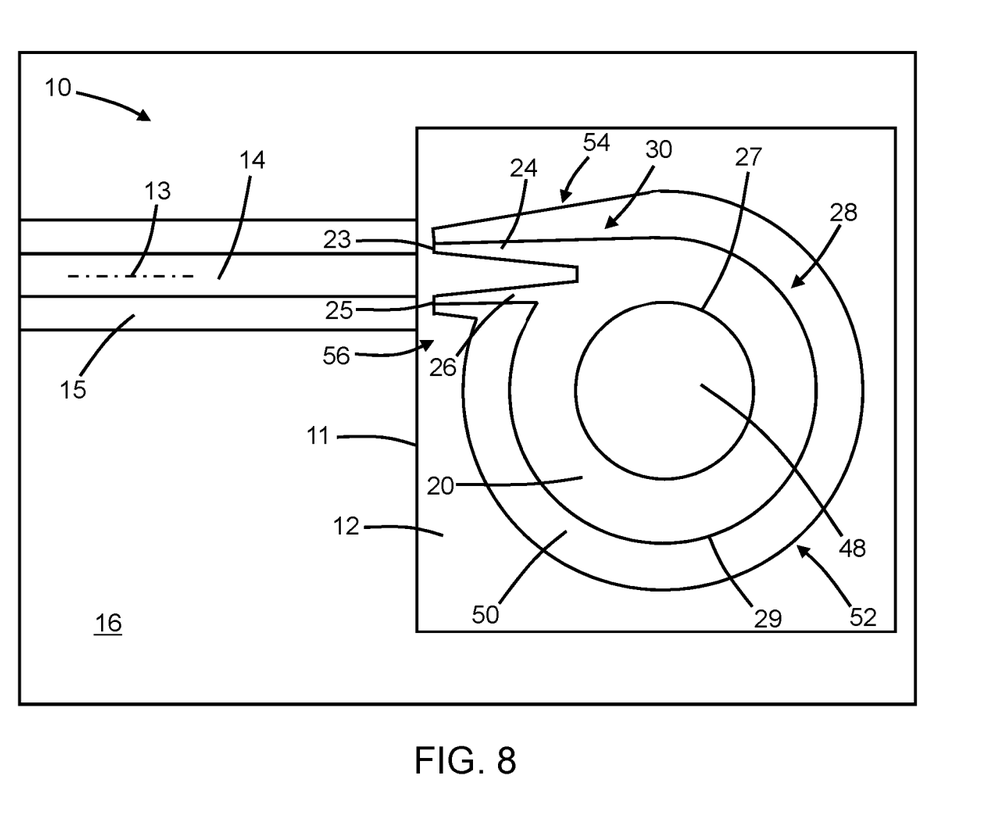
FIGS. 8-11 are top views of structures similar to FIG. 5 that are in accordance with alternative embodiments of the invention.

With reference to FIG. 8 in which like reference numerals refer to like features in FIG. 6 and in accordance with alternative embodiments, the annular portion 28 of the light-absorbing layer 20 may be extended to define a closed single loop that lacks the terminating end 32 and also lacks the gap between the annular portion 28 and the extension 30. In the representative embodiment, the annular portion 28 is a full annulus or ring such that the inner edge 27 is circular and fully surrounds the portion of the pad 12 containing the doped region 48. In addition, the section 52 and the section 56 of the doped region 50 may be merged to eliminate the gap between the sections 52, 56, and the section 56 of the doped region 50 may be tapered over a portion of its length that is not merged with the section 52.

In an alternative embodiment, the doped regions 48, 50 may be omitted from the structure 10 such that the structure 10 defines a terminator. In an embodiment of the terminator, the shape of the annular portion 28 of the body 22 of the light-absorbing layer 20 may be an annulus. In an embodiment of the terminator, the annular portion 28 of the body 22 of the light-absorbing layer 20 may be a full annulus and have an oval shape.

Figure 9:
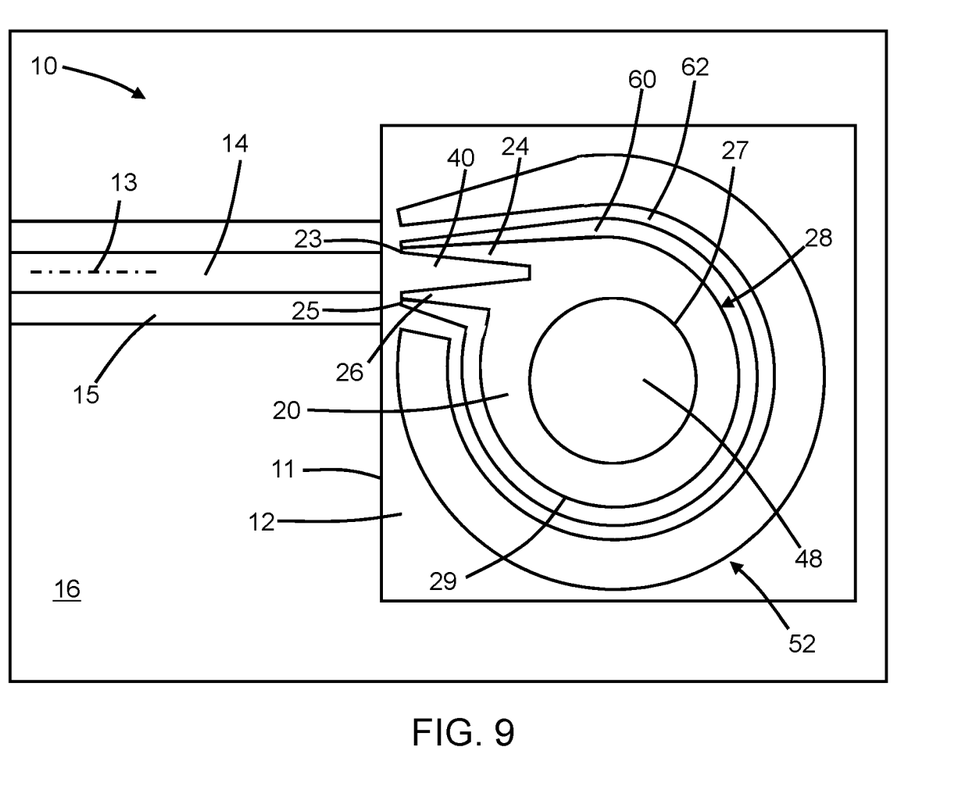

With reference to FIG. 9 in which like reference numerals refer to like features in FIG. 6 and in accordance with alternative embodiments, a region 60 and a region 62 may be positioned between the doped region 50 and the outer edge 29 of the light-absorbing layer 20. In an embodiment, the region 60 may be doped to have an opposite conductivity type from the doped region 50 and the same conductivity type as the doped region 48. In an embodiment, the semiconductor material of the region 60 may contain a p-type dopant (e.g., boron) that provides p-type electrical conductivity, and the dopant concentration in the region 60 may be less than the dopant concentration in the doped region 48. In an embodiment, the region 62 may contain intrinsic semiconductor material that is undoped and lacks a conductivity type. The addition of the region 60 and region 62 provides the structure 10 with an avalanche photodiode construction.

Figure 10:
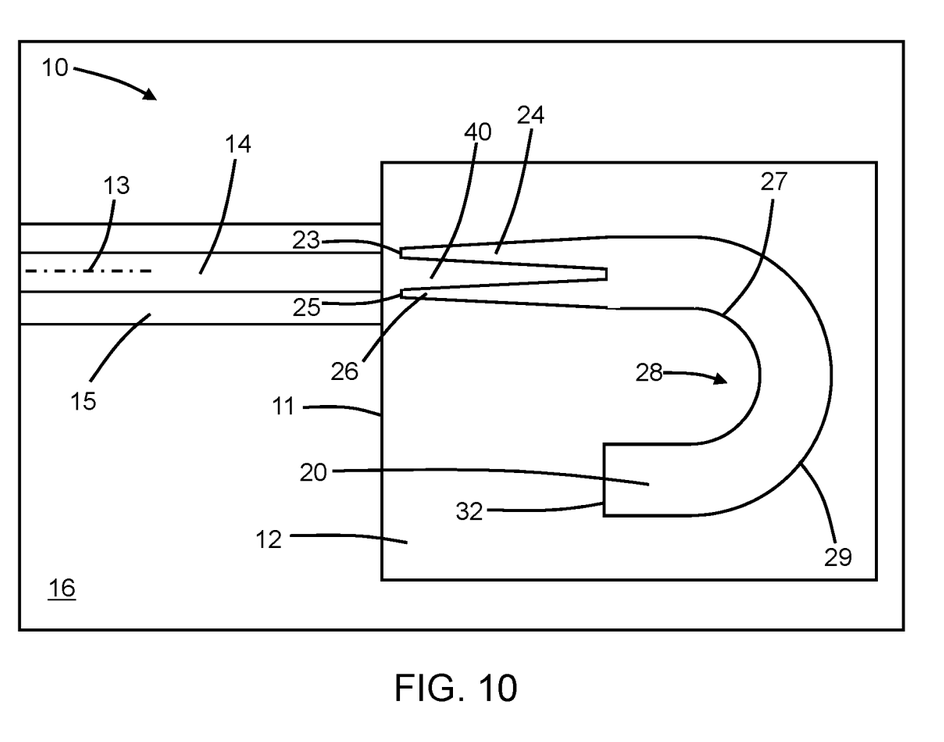

With reference to FIG. 10 in which like reference numerals refer to like features in FIG. 3 and in accordance with alternative embodiments, the annular portion 28 of the light-absorbing layer 20 may be formed with the inner edge 27 and the outer edge 29 having a non-circular shapes, such as ovals. In the representative embodiment, the annular portion 28 is an annular sector and is not a full annulus or ring. In the representative embodiment, the doped regions 48, 50 are omitted such that the structure 10 may function as a terminator.

Figure 11:
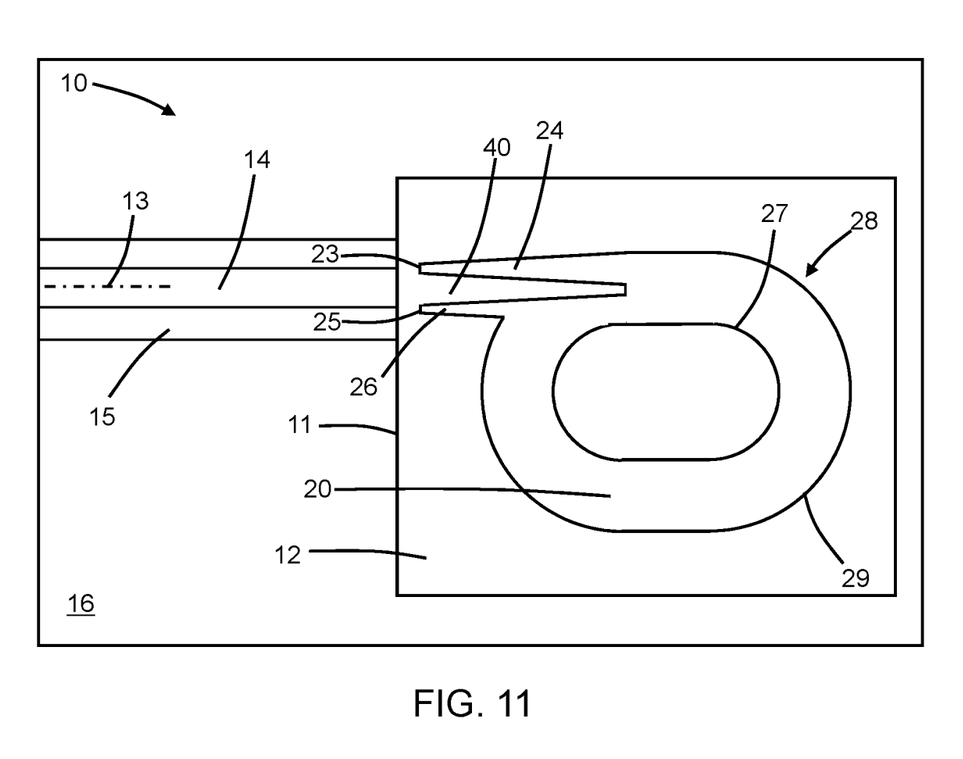

With reference to FIG. 11 in which like reference numerals refer to like features in FIG. 3 and in accordance with alternative embodiments, the annular portion 28 of the light-absorbing layer 20 may be formed with the inner edge 27 and the outer edge 29 having a non-circular shapes, such as ovals. In the representative embodiment, the annular portion 28 is a full annulus or ring. In the representative embodiment, the doped regions 48, 50 are omitted such that the structure 10 may function as a terminator.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a waveguide core having a longitudinal axis;
    a pad connected to the waveguide core;
    a light-absorbing layer on the pad, the light-absorbing layer including an annular portion having a curved shape, a first taper having an end, and a second taper laterally spaced from the first taper, the annular portion of the light-absorbing layer including an inner edge and an outer edge, and the first taper and the second taper positioned adjacent to the waveguide core;
    a first doped region in the pad, the first doped region positioned interior of the inner edge of the light-absorbing layer; and
    a second doped region in the pad, the second doped region including a first section and a second section, the first section adjacent to the outer edge of the light-absorbing layer, the second section positioned adjacent to the first taper, and the second section tapered to terminate at an end adjacent to the end of the first taper,
    wherein the first doped region and the second doped region are doped to have opposite conductivity types.

2. The structure of claim 1 wherein the annular portion of the light-absorbing layer is an annular sector, and the inner edge is a circular arc.

3. The structure of claim 1 wherein the annular portion of the light-absorbing layer is an annulus, and the inner edge is circular.

4. The structure of claim 1 wherein the annular portion of the light-absorbing layer has a length and a constant width along the length.

5. The structure of claim 1 wherein the first doped region is contiguous with the inner edge of the light-absorbing layer.

6. The structure of claim 5 wherein the first doped region fully fills a space that is interior of the inner edge of the light-absorbing layer.

7. The structure of claim 1 wherein the first section of the second doped region is contiguous with the outer edge of the light-absorbing layer.

8. The structure of claim 7 wherein the first section of the second doped region is shaped as a annular sector.

9. The structure of claim 1 further comprising:
    a third doped region in the pad, the third doped region positioned between the first section of the second doped region and the outer edge of the light-absorbing layer,
    wherein the second doped region and the third doped region are doped to have opposite conductivity types.

10. The structure of claim 9 further comprising:
    a region of intrinsic semiconductor material between the second doped region and the third doped region.

11. The structure of claim 1 wherein the pad and the waveguide core are comprised of a semiconductor material, a tapered section of the semiconductor material is centered between the first taper and the second taper, and the tapered section of the semiconductor material is aligned with the longitudinal axis of the waveguide core.

12. The structure of claim 1 wherein the light-absorbing layer comprises a material having a composition that exclusively includes germanium, and the waveguide core and the pad comprise silicon.

13. The structure of claim 1 wherein the pad and the waveguide core comprise silicon, and the light-absorbing layer comprises germanium.

14. A method comprising:
forming a pad and a waveguide core connected to the pad;
forming a light-absorbing layer on the pad, wherein the light-absorbing layer includes an annular portion having a curved shape, a first taper having an end, and a second taper laterally spaced from the first taper, the annular portion of the light-absorbing layer includes an inner edge and an outer edge, and the first taper and the second taper are positioned adjacent to the waveguide core;
forming a first doped region in the pad, wherein the first doped region positioned interior of the inner edge of the light-absorbing layer; and
forming a second doped region in the pad, wherein the second doped region includes a first section and a second section, the first section is adjacent to the outer edge of the light-absorbing layer, the second section is positioned adjacent to the first taper, the second section is tapered to terminate at an end adjacent to the end of the first taper, and the first doped region and the second doped region are doped to have opposite conductivity types.

15. The method of claim 14 wherein the wherein the first doped region fully fills a space that is interior of the inner edge of the light-absorbing layer.

16. The method of claim 14 wherein the annular portion of the light-absorbing layer is an annular sector, and the inner edge is a circular arc.

17. The method of claim 14 wherein the annular portion of the light-absorbing layer is an annulus, and the inner edge is circular.

18. The structure of claim 1 wherein the second doped region includes a third section positioned adjacent to the second taper, the second taper includes an end, and the third section is tapered to terminate at an end adjacent to the end of the second taper.

19. The structure of claim 12 wherein the waveguide core and the pad are portions of a device layer of a semiconductor-on-insulator substrate, the pad includes a trench that penetrates partially through a thickness of the pad, the light-absorbing layer is disposed inside the trench, and the light-absorbing layer includes a portion that projects above a top surface of the pad.

20. The structure of claim 1 wherein the pad includes a side edge, the waveguide core is adjoined to the side edge of the pad, and the first taper and the second taper each taper in a direction toward the waveguide core.

* * * * *